United States Patent
Lee et al.

(10) Patent No.: US 10,477,705 B1
(45) Date of Patent: Nov. 12, 2019

(54) STORAGE DEVICE

(71) Applicant: Apacer Technology Inc., New Taipei (TW)

(72) Inventors: Jiunn-Chang Lee, New Taipei (TW); Jia-Wei Lin, New Taipei (TW); Liang-Cheng Li, New Taipei (TW)

(73) Assignee: APACER TECHNOLOGY INC., New Taipei (TW)

( * ) Notice: Subject to any disclaimer, the term of this patent is extended or adjusted under 35 U.S.C. 154(b) by 0 days.

(21) Appl. No.: 16/414,631

(22) Filed: May 16, 2019

(30) Foreign Application Priority Data

Mar. 28, 2019 (TW) .............................. 108203805 U
Apr. 11, 2019 (TW) .............................. 108112769 A

(51) Int. Cl.
| | | |
|---|---|---|
| *H05K 5/00* | (2006.01) | |
| *H05K 1/18* | (2006.01) | |
| *H01R 25/00* | (2006.01) | |
| *H01R 27/02* | (2006.01) | |
| *H01R 12/71* | (2011.01) | |

(52) U.S. Cl.
CPC ......... *H05K 5/0047* (2013.01); *H01R 25/006* (2013.01); *H01R 27/02* (2013.01); *H05K 1/181* (2013.01); *H01R 12/712* (2013.01); *H05K 2201/10159* (2013.01); *H05K 2201/10189* (2013.01)

(58) Field of Classification Search
CPC combination set(s) only.
See application file for complete search history.

(56) References Cited

U.S. PATENT DOCUMENTS

| | | | | |
|---|---|---|---|---|
| 7,233,489 | B2* | 6/2007 | Toyama ............... | G06K 7/0013 361/679.31 |
| 7,522,424 | B2* | 4/2009 | Mambakkan ......... | H01R 27/00 235/492 |
| 8,189,328 | B2* | 5/2012 | Kanapathippillai ..... | G11C 5/04 361/679.32 |
| 8,476,908 | B2* | 7/2013 | Choi ...................... | G11C 29/56 324/537 |
| 9,900,999 | B1* | 2/2018 | Lim ...................... | H04N 5/2256 |
| 2017/0094781 | A1* | 3/2017 | Bang .................... | H05K 1/0271 |
| 2018/0190634 | A1* | 7/2018 | Aoki ...................... | H01L 25/18 |
| 2019/0037695 | A1* | 1/2019 | Li .......................... | H05K 1/14 |
| 2019/0215972 | A1* | 7/2019 | Jang ...................... | G06F 1/16 |

\* cited by examiner

*Primary Examiner* — Lisa Lea-Edmonds
(74) *Attorney, Agent, or Firm* — Kirton McConkie; Evan R. Witt

(57) ABSTRACT

A storage device includes a first housing, a second housing, a circuit board, a first electric connector, a first storage unit, a second electric connector and a second storage unit. The second housing is matched with the first housing and connected with the first housing. The circuit board is disposed between the first housing and the second housing. The first electric connector is disposed on the circuit board. The first storage unit is disposed on the circuit board and electrically connected with the first electric connector. The second electric connector is disposed on the circuit board. The second storage unit is disposed on the circuit board and electrically connected with the second electric connector. The first storage unit and the second storage unit are independent from each other. Therefore, the advantages of utilizing two independent storage units on single one product are achieved.

13 Claims, 12 Drawing Sheets

STORAGE DEVICE

CROSS-REFERENCE TO RELATED APPLICATION

This application claims priorities from Taiwan Patent Applications No. 108203805, filed on Mar. 28, 2019, and No. 108112769, filed on Apr. 11, 2019, the entire contents of which are incorporated herein by reference for all purposes.

FIELD OF THE INVENTION

The present invention relates to a storage device, and more particularly to a storage device with electric connectors.

BACKGROUND OF THE INVENTION

The conventional storage devices are usually standard with 2.5 inches specification to be applied to the usual computers. Regardless of whether the primary transmission interface is SATA or PCIe, existing storage devices use only one electrical connector for connection.

When a user wants to use two independent hard disks for some special functions, two standard 2.5-inch hard disks must be prepared, and the corresponding cables and electrical connectors must be prepared, too. Not only the total size of the product is large, it is more likely that the specific function cannot be used because the communication protocols used by the two hard disks or the specifications of the two hard disks are different.

Therefore, there is a need of providing an improved storage device distinct from the prior art in order to solve the above drawbacks.

SUMMARY OF THE INVENTION

Some embodiments of the present invention are to provide a storage device in order to overcome at least one of the above-mentioned drawbacks encountered by the prior arts.

The present invention provides a storage device. By disposing a first storage unit and a second storage unit which are independent from each other on a circuit board simultaneously and making the first storage unit and the second storage unit electrically and respectively connect with a first electric connector and a second electric connector, the advantages of utilizing two independent storage units on single one product are achieved.

The present invention also provides a storage device. Since the electric connectors are compatible with several communication protocols and the housings are selected to be 2.5-inch standard specification, not only the application range are effectively enhanced, but also the product volume is effectively reduced. Furthermore, the first storage unit and the second storage unit may be assembled or combined to form a disk array, such that high-end applications such as RAID can be performed through single one 2.5-inch storage device.

In accordance with an aspect of the present invention, there is provided a storage device. The storage device includes a first housing, a second housing, a circuit board, a first electric connector, a first storage unit, a second electric connector and a second storage unit. The second housing is matched with the first housing and connected with the first housing. The circuit board is disposed between the first housing and the second housing. The first electric connector is disposed on the circuit board. The first storage unit is disposed on the circuit board and electrically connected with the first electric connector. The second electric connector is disposed on the circuit board. The second storage unit is disposed on the circuit board and electrically connected with the second electric connector. The first storage unit and the second storage unit are independent from each other.

In accordance with another aspect of the present invention, there is provided a storage device. The storage device includes a first housing, a second housing, a first circuit board, a first electric connector, a first storage unit, a second circuit board, a second electric connector and a second storage unit. The second housing is matched with the first housing and connected with the first housing. The first circuit board is disposed between the first housing and the second housing. The first electric connector is disposed on the first circuit board. The first storage unit is disposed on the first circuit board and electrically connected with the first electric connector. The second circuit board is disposed between the first housing and the second housing and disposed parallel to the first circuit board. The second electric connector is disposed on the second circuit board. The second storage unit is disposed on the second circuit board and electrically connected with the second electric connector. The first storage unit and the second storage unit are independent from each other.

In accordance with another aspect of the present invention, there is provided a storage device. The storage device includes a first housing, a second housing, a circuit board, a first electric connector, a storage unit and a second electric connector. The second housing is matched with the first housing and connected with the first housing. The circuit board is disposed between the first housing and the second housing. The first electric connector is disposed on the circuit board. The storage unit is disposed on the circuit board and electrically connected with the first electric connector. The second electric connector is disposed on the circuit board.

The above contents of the present invention will become more readily apparent to those ordinarily skilled in the art after reviewing the following detailed description and accompanying drawings, in which:

DETAILED DESCRIPTION OF THE PREFERRED EMBODIMENT

The present invention will now be described more specifically with reference to the following embodiments. It is to be noted that the following descriptions of preferred embodiments of this invention are presented herein for purpose of illustration and description only. It is not intended to be exhaustive or to be limited to the precise form disclosed.

Figure 1:
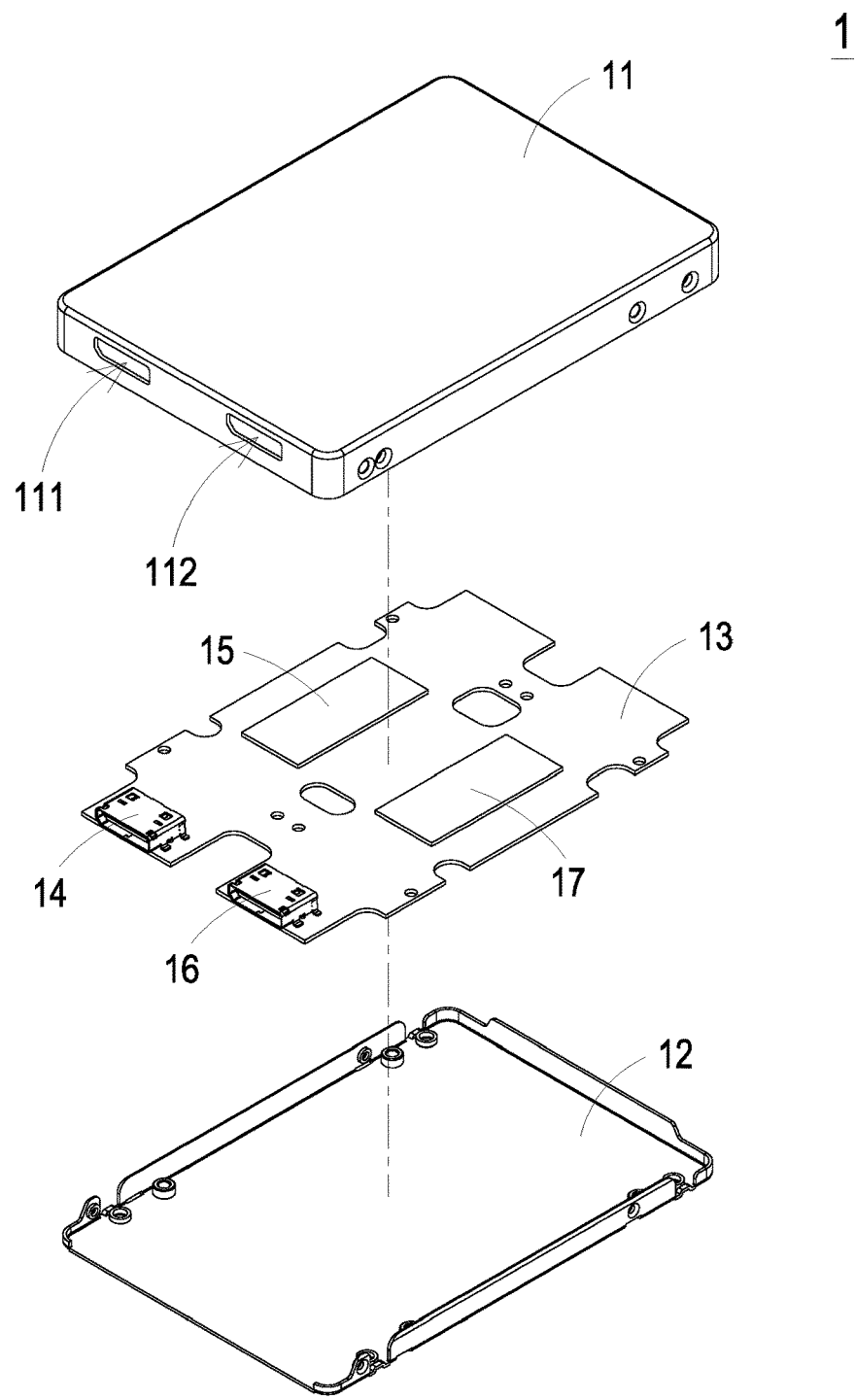
FIG. 1 schematically illustrates the exploded view of a storage device according to an embodiment of the present invention.
Figure 2:
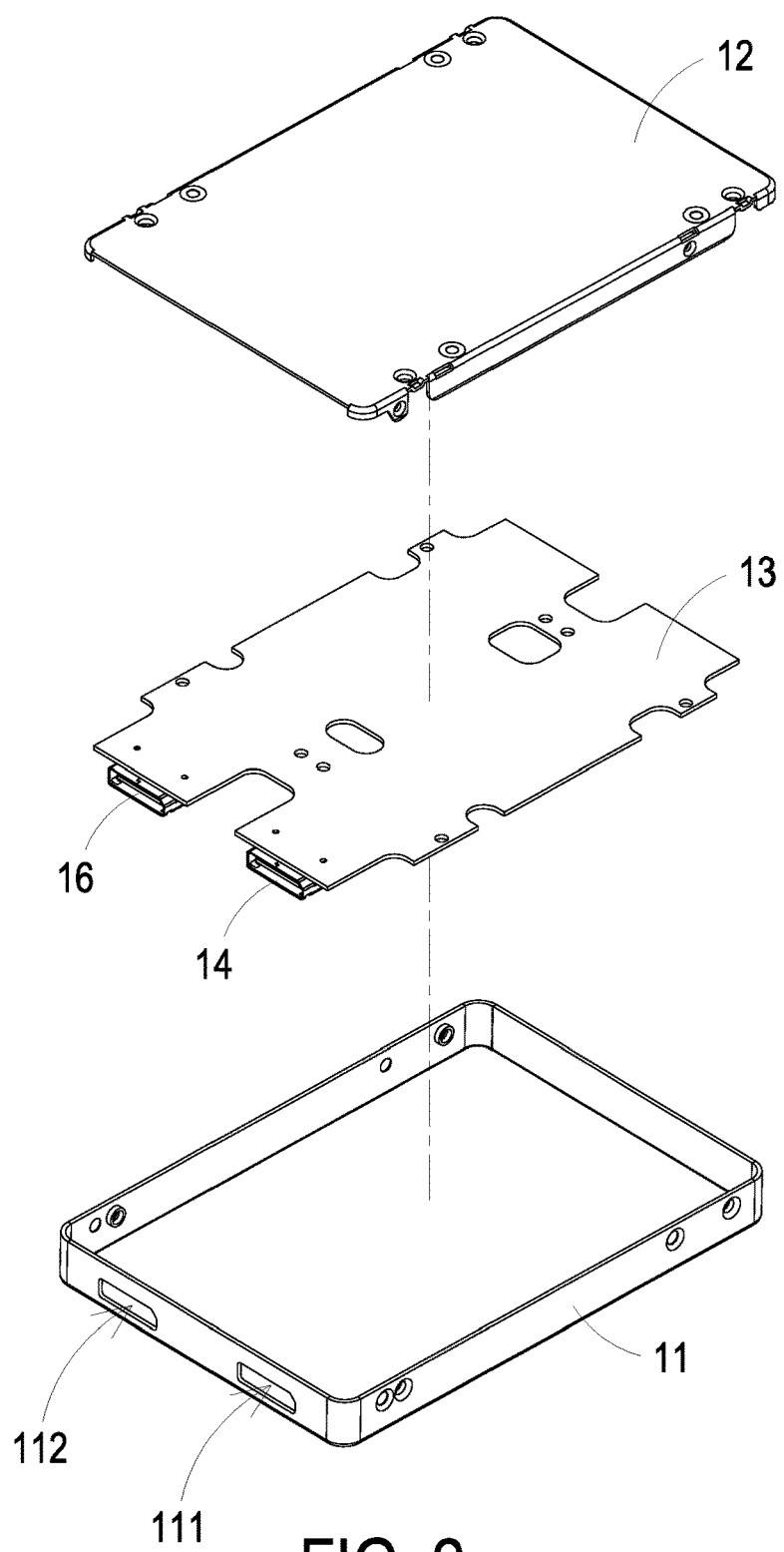
FIG. 2 schematically illustrates another exploded view of the storage device shown in FIG. 1.
Figure 3:
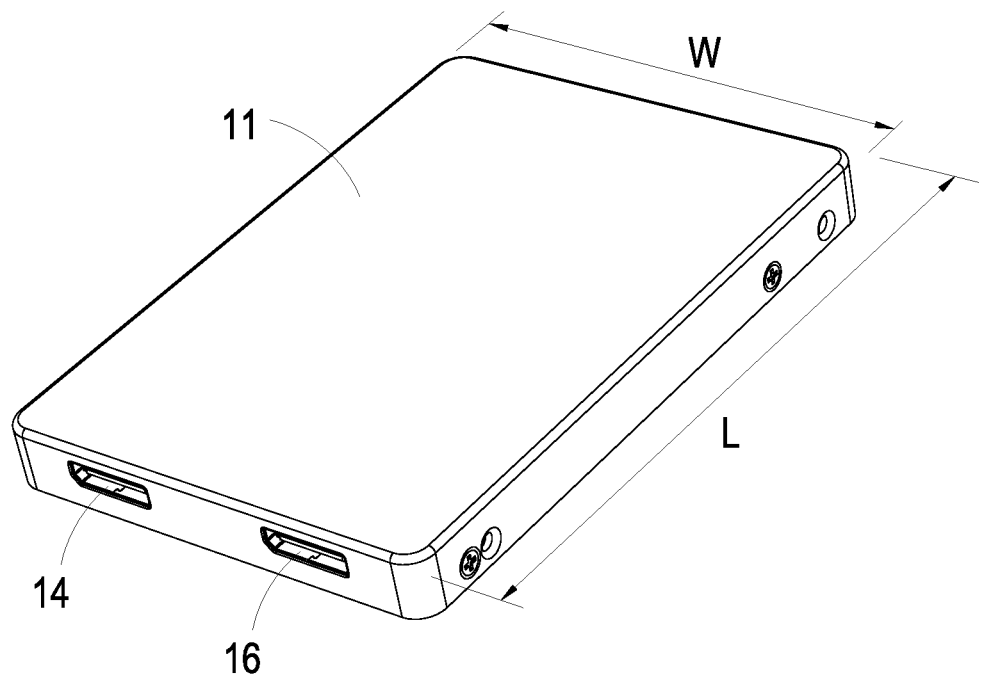
FIG. 3 schematically illustrates the assembled structure of the storage device shown in FIG. 1.

Please refer to FIG. 1, FIG. 2 and FIG. 3. FIG. 1 schematically illustrates the exploded view of a storage device according to an embodiment of the present invention. FIG. 2 schematically illustrates another exploded view of the storage device shown in FIG. 1. FIG. 3 schematically illustrates the assembled structure of the storage device shown in FIG. 1. As shown in FIGS. 1-3, a storage device 1 according to an embodiment of the present invention includes a first housing 11, a second housing 12, a circuit board 13, a first electric connector 14, a first storage unit 15, a second electric connector 16 and a second storage unit 17. The second housing 12 is matched with the first housing 11 and connected with the first housing 11. An accommodation space can be defined by the first housing 11 and the second housing 12 for receiving the circuit board 13, the first electric connector 14, the first storage unit 15, the second electric connector 16 and the second storage unit 17, but not limited thereto. The circuit board 13 is disposed between the first housing 11 and the second housing 12. The first electric connector 14 is disposed on the circuit board 13. The first storage unit 15 is disposed on the circuit board 13 and electrically connected with the first electric connector 14. The electric connection between the first storage unit 15 and the first electric connector 14 is preferably implemented through printed circuits on the circuit board 13, but not limited thereto. The second electric connector 16 is disposed on the circuit board 13. The second storage unit 17 is disposed on the circuit board 13 and electrically connected with the second electric connector 16. The electric connection between the second storage unit 17 and the second electric connector 16 is preferably implemented through printed circuits on the circuit board 13, but not limited thereto. It should be noted that the first storage unit 15 and the second storage unit 17 are independent from each other. In other words, the electric connection between the first storage unit 15, the circuit board 13 and the first electric connector 14 is independent from the electric connection between the second storage unit 17, the circuit board 13 and the second electric connector 16. Therefore, the advantages of utilizing two independent storage units on single one product are achieved.

In specific, the first storage unit 15 is powered through the first electric connector 14 and the circuit board 13, the first storage unit 15 transmits data through the first electric connector 14 and the circuit board 13, the second storage unit 17 is powered by the second electric connector 16 and the circuit board 13, and the second storage unit 17 transmits data through the second electric connector 16 and the circuit board 13. The data stored in the first storage unit 15 and the data stored in the second storage unit 17 are independent and different. In other words, when the first storage unit 15 is going to be accessed, the first electric connector 14 must be connected, and when the second storage unit 17 is going to be accessed, the second electric connector 16 must be connected.

Under this circumstance, a disk array is preferably formed by the first storage unit 15 and the second storage unit 17, which are independent from each other, or applied to operate with specific applications for specific functions, such as backup, mirroring, increased access speed and/or security unlocking, but not limited thereto.

In addition, a length L of the first housing 11 of the storage device 1 of the present invention is preferably 100 mm, a width W of the first housing 11 of the storage device 1 is preferably 70 mm, and a diagonal length is preferably 2.5 inches (i.e. the standard 2.5-inch solid-state drive).

In brief, the storage device 1 of the present invention is compatible with various communication protocols through the electric connectors, and the housings adopt the standard 2.5-inch specification, which not only can effectively improve the application range of the product, but also can implement miniaturization, effectively reduce the product volume, and can be used for high-end applications.

In some embodiments, the first electric connector 14 and the second electric connector 16 have the same interface and specification. For example, the first electric connector 14 and the second electric connector 16 can both compatible with serial attached SCSI (SAS) protocol, serial advanced technology attachment (SATA) protocol and peripheral component interconnect express (PCIe) protocol, and can both be a Nano-pitch I/O connector, but not limited thereto.

In some embodiments, the first housing 11 of the storage device 1 has a first opening 111 and a second opening 112, the first electric connector 14 is partially penetrated through the first opening 111, and the second electric connector 16 is partially penetrated through the second opening 112.

Figure 4:
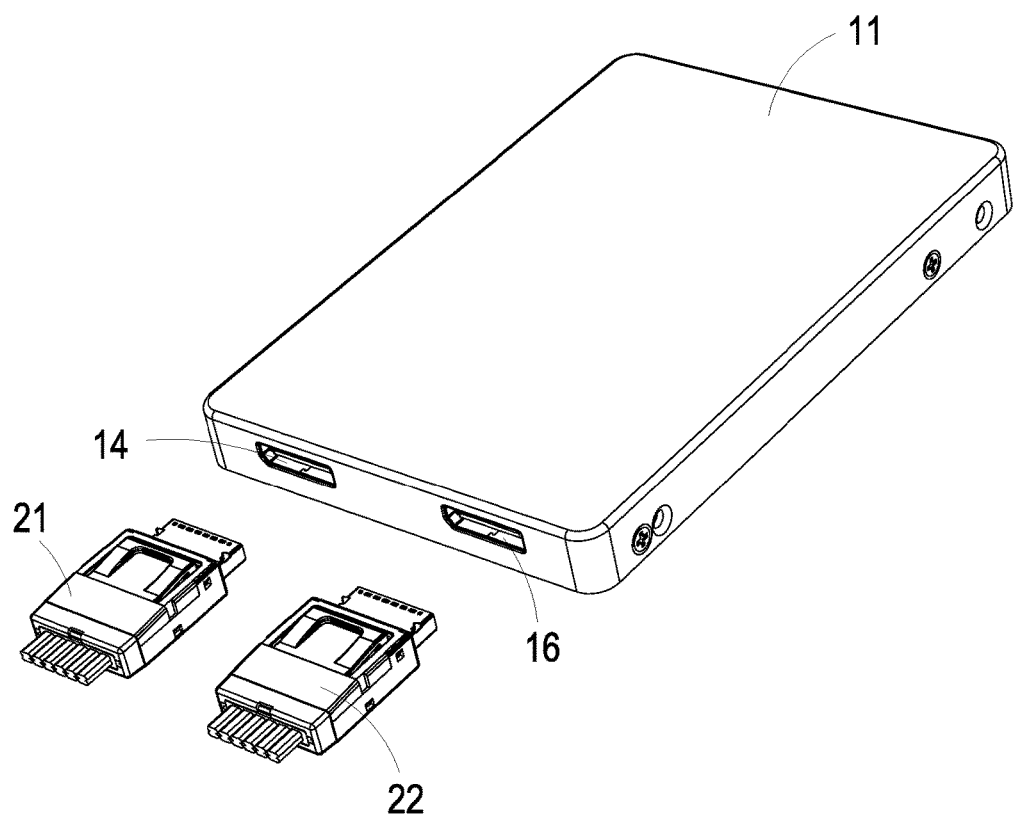
FIG. 4 schematically illustrates the structures of a storage device of the present invention and two Nano-pitch I/O connectors.
Figure 5:
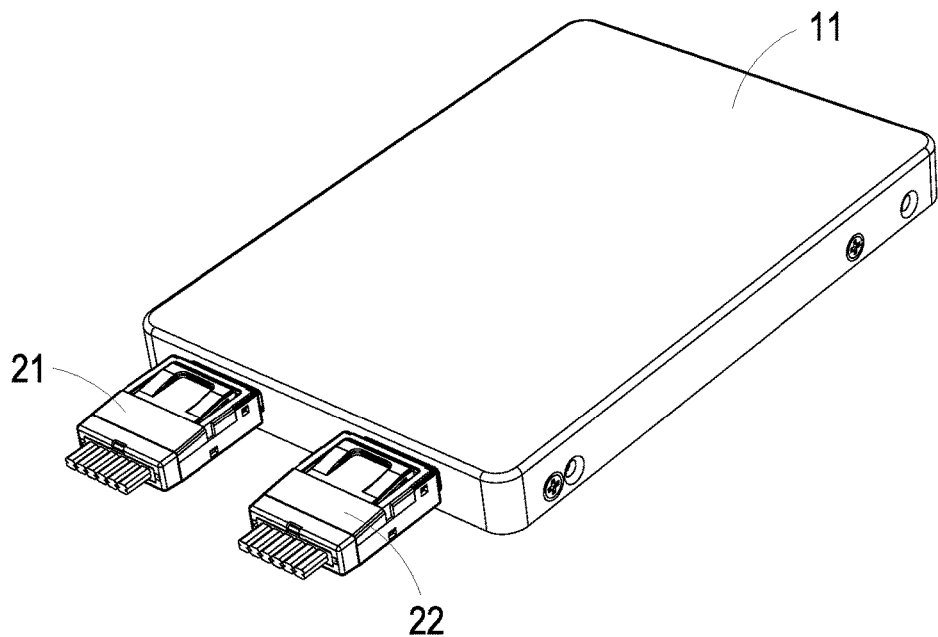
FIG. 5 schematically illustrates the structure of the storage device installed with the two Nano-pitch I/O connectors.

Please refer to FIG. 1, FIG. 4 and FIG. 5. FIG. 4 schematically illustrates the structures of a storage device of the present invention and two Nano-pitch I/O connectors. FIG. 5 schematically illustrates the structure of the storage device installed with the two Nano-pitch I/O connectors. As shown in FIG. 1, FIG. 4 and FIG. 5, when the first electric connector 14 and the second electric connector 16 of the storage device 1 are selected as Nano-pitch I/O connectors, and particularly female Nano-pitch I/O connectors, the first electric connector 14 and the second electric connector 16 can be respectively connected through a first male Nano-pitch I/O connector 21 and a second male Nano-pitch I/O connector 22 for respectively accessing the first storage unit 15 and the second storage unit 17. When the first male Nano-pitch I/O connector 21 and the second male Nano-pitch I/O connector 22 are installed on the storage device 1 of the present invention, the first male Nano-pitch I/O connector 21 is partially penetrated through the first opening 111, and the second male Nano-pitch I/O connector 22 is partially penetrated through the second opening 112.

Figure 6:
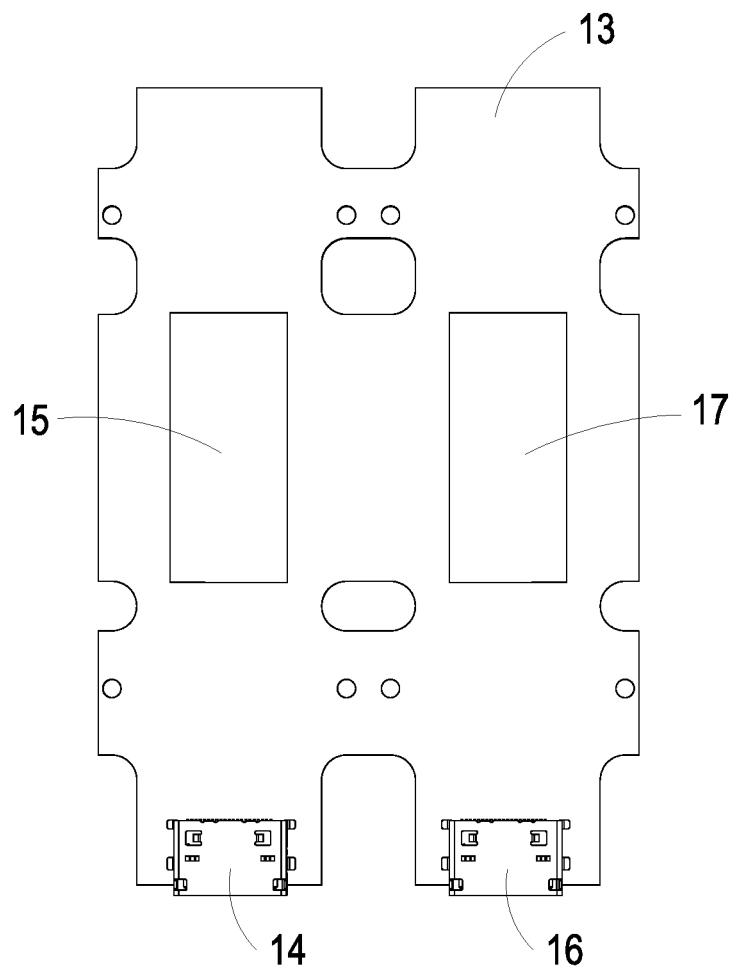
FIG. 6 schematically illustrates the top view of the circuit board of the storage device shown in FIG. 1.

Please refer to FIG. 1 and FIG. 6. FIG. 6 schematically illustrates the top view of the circuit board of the storage device shown in FIG. 1. As shown in FIG. 1 and FIG. 6, the structure of the circuit board 13 of the present invention is preferably a symmetric structure. Additionally, the first electric connector 14 and the first storage unit 15 can also be symmetric to the second electric connector 16 and the second storage unit 17, and they are preferred to be line-symmetric.

Figure 7:
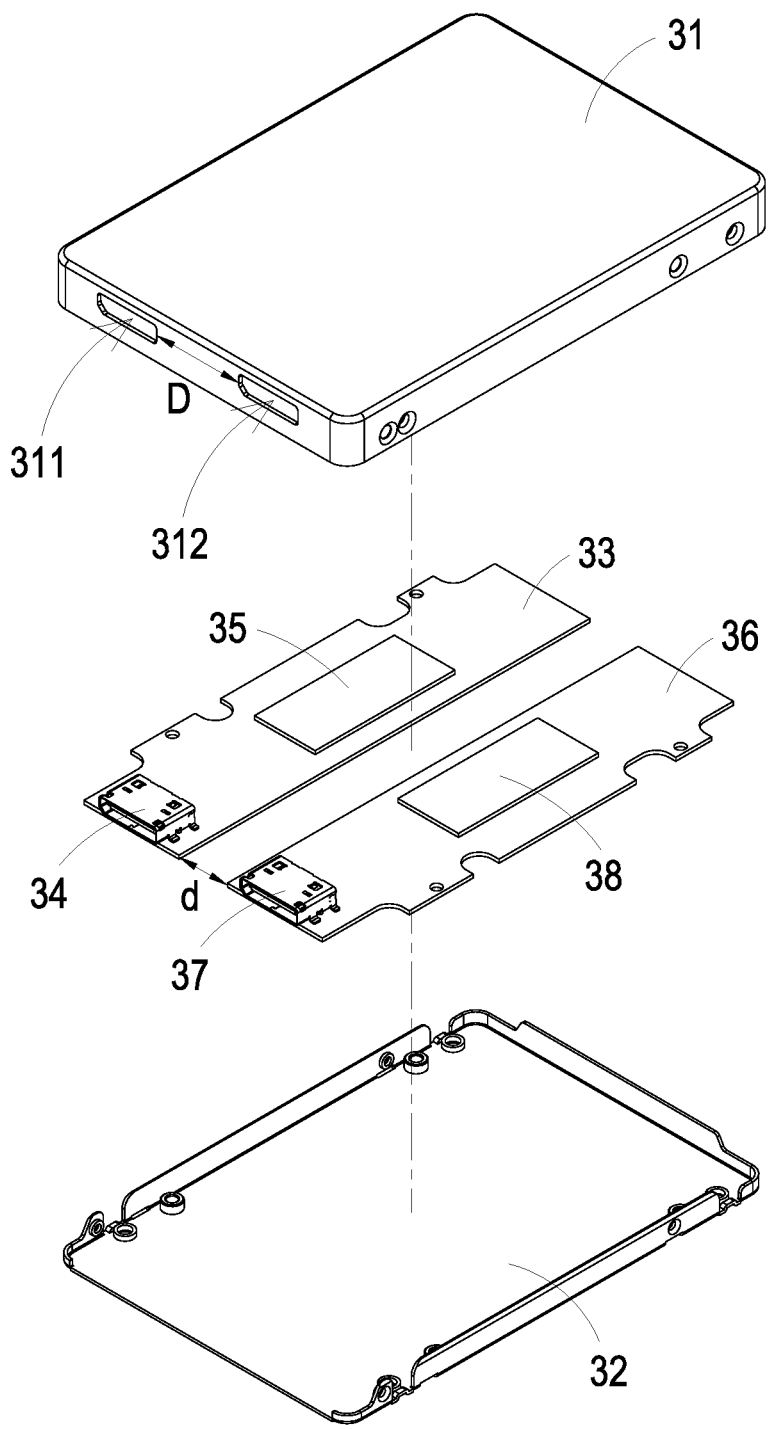
FIG. 7 schematically illustrates the exploded view of a storage device according to an embodiment of the present invention.
Figure 8:
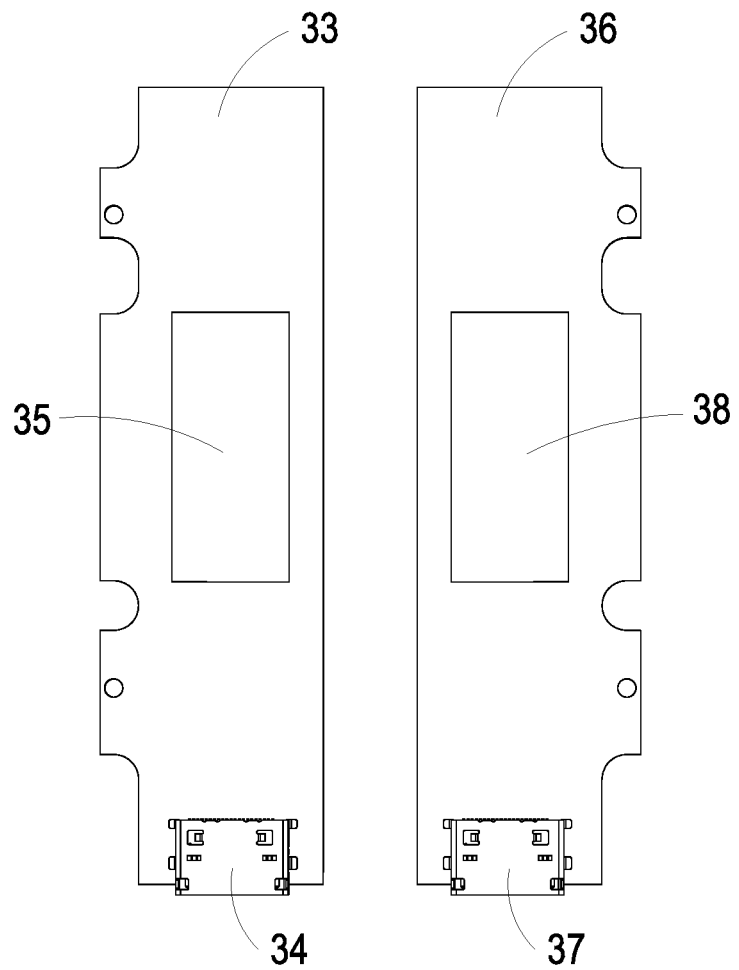
FIG. 8 schematically illustrates the top view of the first circuit board and the second circuit board of the storage device shown in FIG. 7.

Please refer to FIG. 7 and FIG. 8. FIG. 7 schematically illustrates the exploded view of a storage device according to an embodiment of the present invention. FIG. 8 schematically illustrates the top view of the first circuit board and the second circuit board of the storage device shown in FIG. 7. As shown in FIG. 7 and FIG. 8, a storage device 3 according to another embodiment of the present invention includes a first housing 31, a second housing 32, a first circuit board 33, a first electric connector 34, a first storage unit 35, a second circuit board 36, a second electric connector 37 and a second storage unit 38. The second housing 32 is matched with the first housing 31 and connected with the first housing 31. The first circuit board 33 is disposed between the first housing 31 and the second housing 32. The first electric connector 34 is disposed on the first circuit board 33. The first storage unit 35 is disposed on the first circuit board 33 and electrically connected with the first electric connector 34. The second circuit board 36 is disposed between the first housing 31 and the second housing 32 and disposed parallel to the first circuit board 33. The second electric connector 37 is disposed on the second circuit board 36. The second storage unit 38 is disposed on the second circuit board 36 and electrically connected with the second electric connector 37. The first storage unit 35 and the second storage unit 38 are independent from each other.

The difference between this embodiment and the embodiments mentioned above is that the storage device 3 includes two circuit boards (i.e. the first circuit board 33 and the second circuit board 36) in this embodiment. The first circuit board 33 and the second circuit board 36 are parallel. In other words, the storage device 3 of the present invention can be designed by using two independently manufactured circuit boards with corresponding electric connectors and storage units, not only directly using existing products, but also adding convenience during maintenance and replacement.

In some embodiments, the first housing 31 has a first opening 311 and a second opening 312, the first electric connector 34 is partially penetrated through the first opening 311, and the second electric connector 37 is partially penetrated through the second opening 312. The distance between the first opening 311 and the second opening 312 is a first distance D. The distance between the first circuit board 33 and the second circuit board 36 is a second distance d. The first distance D is greater than the second distance d.

Moreover, the selectivity and compatibility of the first electric connector 34 and the second electric connector 37, and the disk array and specific functions, which can be implemented through the first storage unit 35 and the second storage unit 38, are similar with the above-mentioned embodiments, so that it is not redundantly described herein.

Figure 9:
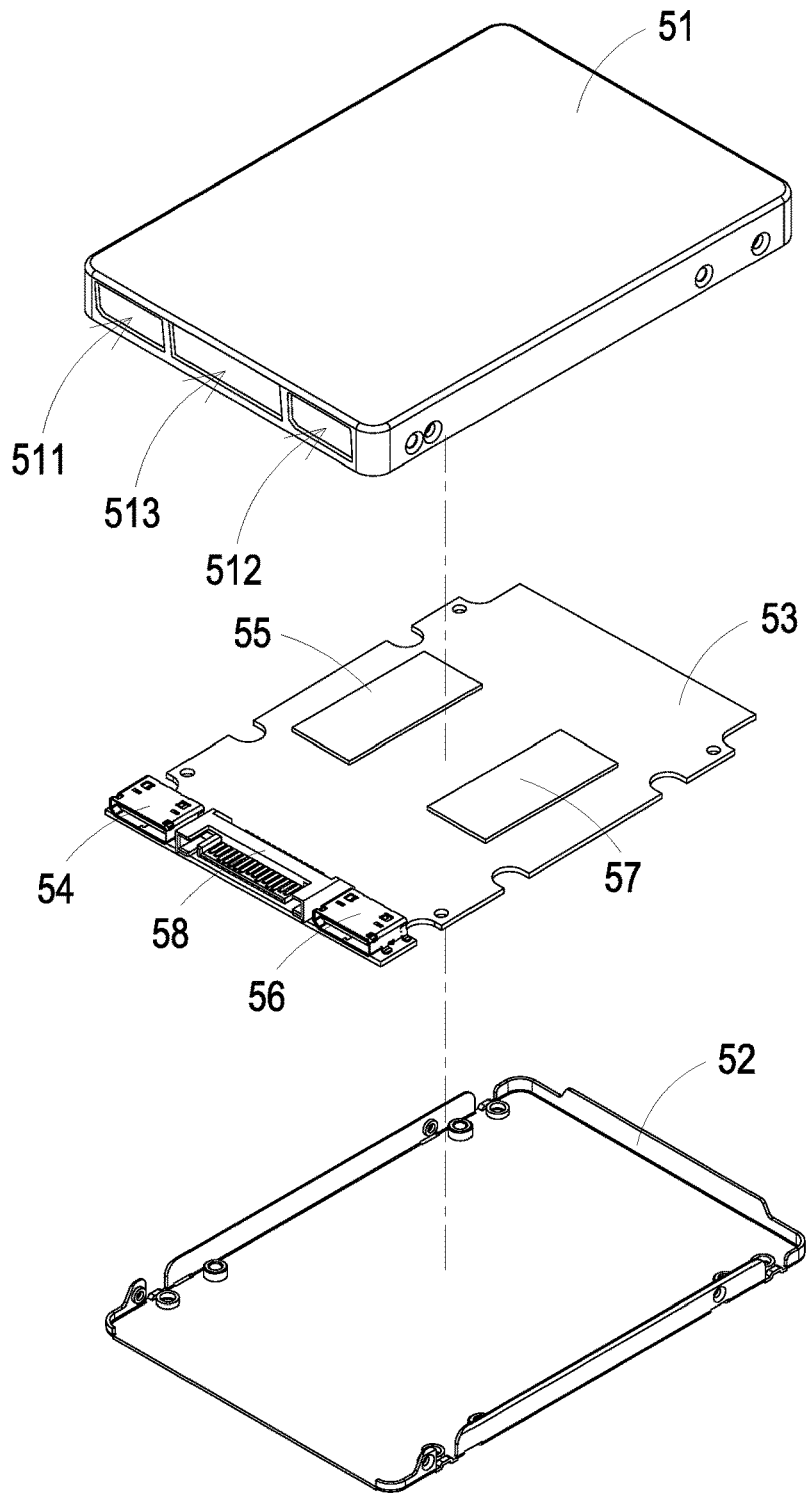
FIG. 9 schematically illustrates the exploded view of a storage device according to an embodiment of the present invention.
Figure 10:
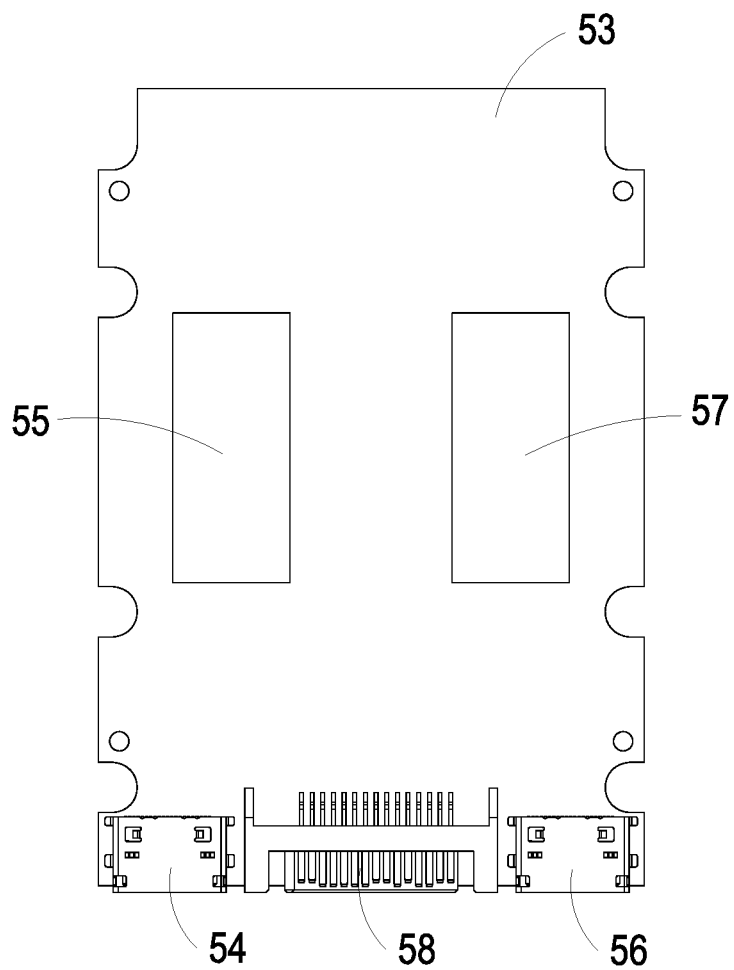
FIG. 10 schematically illustrates the top view of the circuit board of the storage device shown in FIG. 9.

Please refer to FIG. 9 and FIG. 10. FIG. 9 schematically illustrates the exploded view of a storage device according to an embodiment of the present invention. FIG. 10 schematically illustrates the top view of the circuit board of the storage device shown in FIG. 9. As shown in FIG. 9 and FIG. 10, a storage device 5 according to another embodiment of the present invention includes a first housing 51, a second housing 52, a circuit board 53, a first electric connector 54, a first storage unit 55, a second electric connector 56, a second storage unit 57 and a third electric connector 58. The second housing 52, the circuit board 53, the first electric connector 54, the first storage unit 55, the second electric connector 56 and the second storage unit 57 are similar with the above-mentioned embodiments, so that it is not redundantly described herein. It is worthy mentioned that the third electric connector 58 is disposed on the circuit board 53. The third electric connector 58 can be for example a SATA power connector with number of pins equals to 15 and voltage equals to 12 volts, but not limited herein. It is worthy noted that the SATA power connector is a power connector but not a data transmission connector. An independent power source is stable and safe. The first housing 51 of the storage device 5 further includes a third opening 513. The third electric connector 58 is partially penetrated through the third opening 513. In this embodiment, the first storage unit 55 and the second storage unit 57 are independent from each other. When a SATA power connector is inserted into the third electric connector 58 for powering, the first storage unit 55 and the second storage unit 57 share the power source, however the data is still independent. Therefore, the selections of the first storage unit 55 and the second storage unit 57 are not limited by the voltage specifications of the first electric connector 54 and the second electric connector 56 (e.g. 5 volts). That is, storage units with large capacity are possible to be chosen and are able to be powered stably and continuously by the third electric connector 58. Meanwhile, the signal interference problems caused by simultaneously powering and data-transmitting of the first electric connector 54 and the second electric connector 56 can be avoided. In other words, when the first electric connector 54, the second electric connector 56 and the third electric connector 58 are simultaneously utilized, the first electric connector 54 and the second electric connector 56 are used for data and signal transmission, and the third electric connector 58 is used only for powering.

In addition, in the embodiments shown in FIG. 7 and FIG. 8, the storage device 3 may include a third electric connector. The third electric connector is disposed on the first circuit board 33 and the second circuit board 36 (not shown). The first housing 31 has a third opening (not shown), and the third electric connector is partially penetrated through the third opening. It is similar with the foregoing embodiments, so it is not redundantly shown and described herein.

Figure 11:
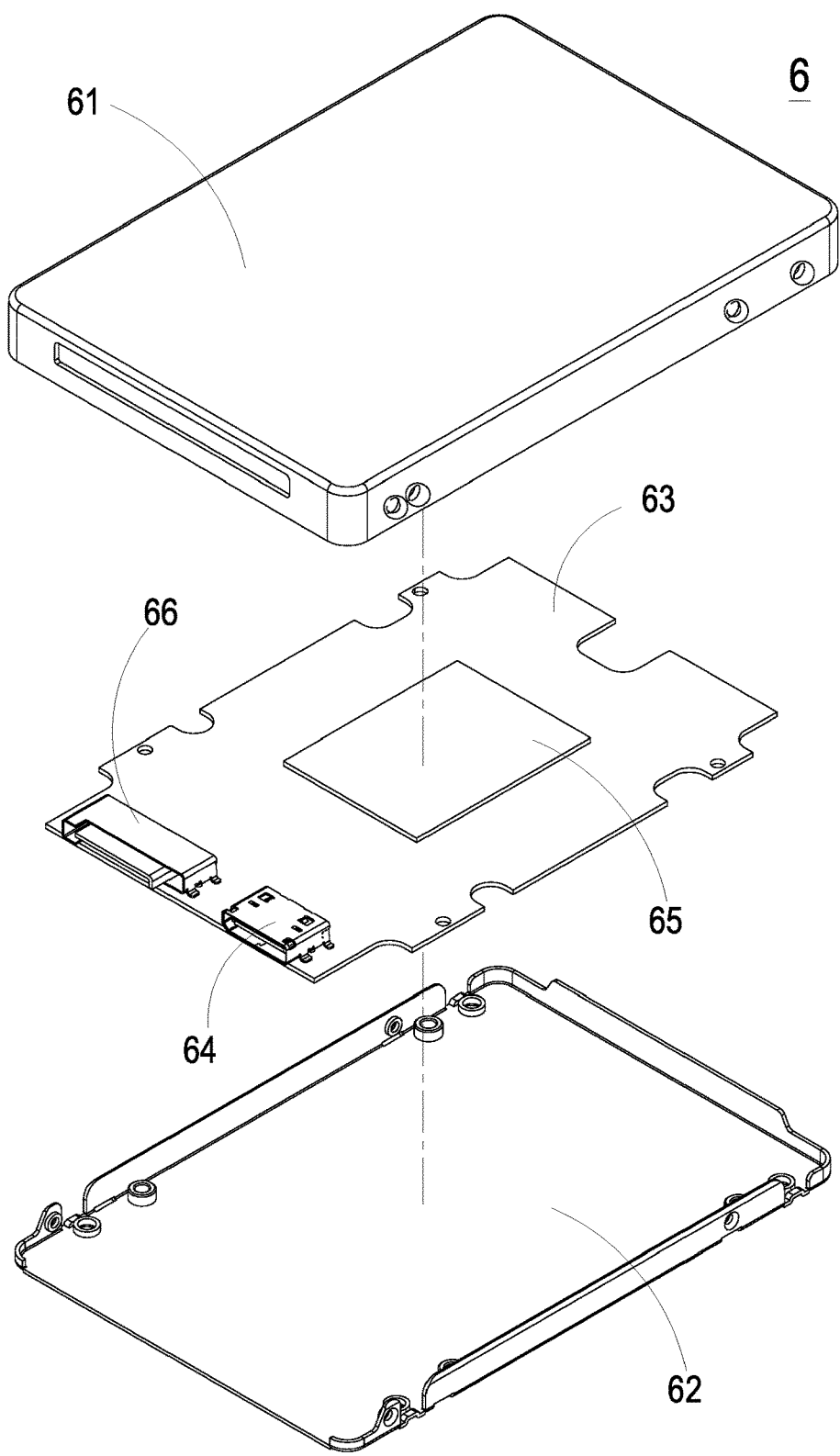
FIG. 11 schematically illustrates the exploded view of a storage device according to an embodiment of the present invention.
Figure 12:
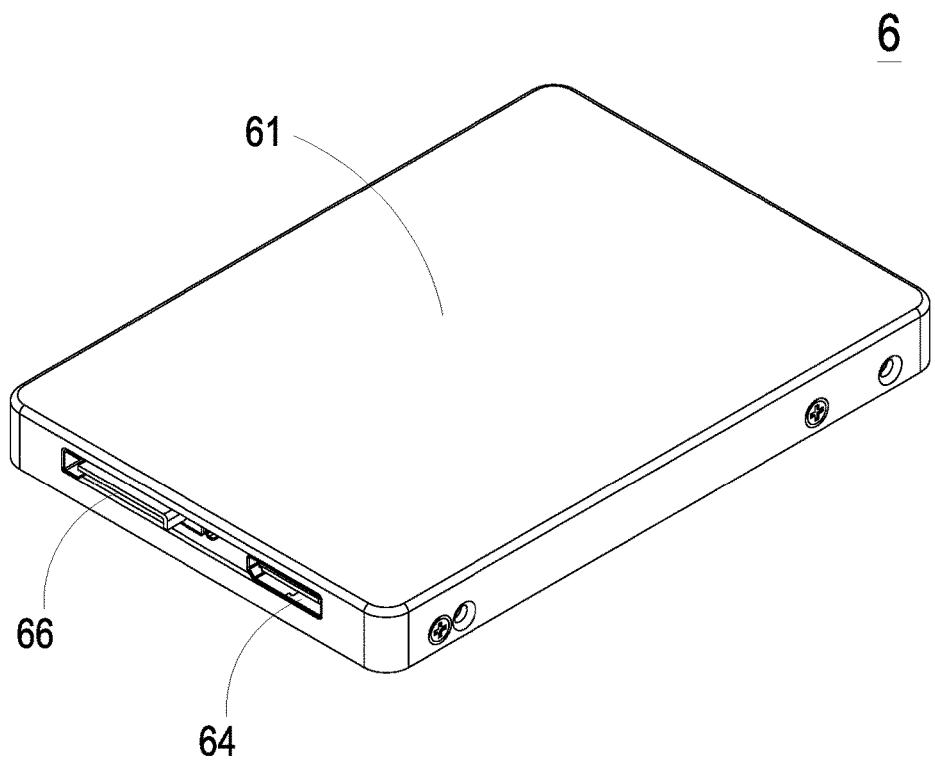
FIG. 12 schematically illustrates the assembled structure of the storage device shown in FIG. 11.

Please refer to FIG. 11 and FIG. 12. FIG. 11 schematically illustrates the exploded view of a storage device according to an embodiment of the present invention. FIG. 12 schematically illustrates the assembled structure of the storage device shown in FIG. 11. As shown in FIG. 11 and FIG. 12, a storage device 6 according to another embodiment of the present invention includes a first housing 61, a second housing 62, a circuit board 63, a first electric connector 64, a storage unit 65 and a second electric connector 66. The second housing 62 is matched with the first housing 61 and connected with the first housing 61. The circuit board 63 is disposed between the first housing 61 and the second housing 62. The first electric connector 64 is disposed on the circuit board 63. The storage unit 65 is disposed on the circuit board 63 and electrically connected with the first electric connector 64. The second electric connector 66 is disposed on the circuit board 63.

In some embodiments, the first electric connector 64 is a Nano-pitch I/O connector, and the second electric connector 66 is a SATA power connector. The first electric connector 64 is disposed adjacent to the second electric connector 66. In some embodiments, the second electric connector 66 is electrically connected with the storage unit 65 for powering the storage unit 65, and a high-speed signal is transmitted to the storage unit 65 through the first electric connector 64. In brief, the first electric connector 64 is used for data transmission, and the second electric connector 66 is used for powering.

From the above discussion, the present invention provides storage device. By disposing a first storage unit and a second storage unit which are independent from each other on a circuit board simultaneously and making the first storage unit and the second storage unit electrically and respectively connect with a first electric connector and a second electric connector, the advantages of utilizing two independent storage units on single one product are achieved. Meanwhile, since the electric connectors are compatible with several communication protocols and the housings are selected to be 2.5-inch standard specification, not only the application range are effectively enhanced, but also the product volume is effectively reduced. Furthermore, the first storage unit and the second storage unit may be assembled or combined to form a disk array, such that high-end applications such as RAID can be performed through single one 2.5-inch storage device.

While the invention has been described in terms of what is presently considered to be the most practical and preferred embodiments, it is to be understood that the invention needs not be limited to the disclosed embodiment. On the contrary, it is intended to cover various modifications and similar arrangements included within the spirit and scope of the appended claims which are to be accorded with the broadest interpretation so as to encompass all such modifications and similar structures.

What is claimed is:

1. A storage device, comprising:
   a first housing;
   a second housing matched with the first housing and connected with the first housing;
   a circuit board disposed between the first housing and the second housing;
   a first electric connector disposed on the circuit board;
   a first storage unit disposed on the circuit board and electrically connected with the first electric connector;
   a second electric connector disposed on the circuit board; and
   a second storage unit disposed on the circuit board and electrically connected with the second electric connector, wherein the first storage unit and the second storage unit are independent from each other.

2. The storage device according to claim 1, wherein the first storage unit is powered through the first electric connector and the circuit board, the first storage unit transmits data through the first electric connector and the circuit board, the second storage unit is powered by the second electric connector and the circuit board, and the second storage unit transmits data through the second electric connector and the circuit board.

3. The storage device according to claim 1, wherein the first electric connector and the second electric connector have the same interface and specification, and a disk array is formed by the first storage unit and the second storage unit.

4. The storage device according to claim 3, wherein the first electric connector and the second electric connector are Nano-pitch I/O connectors compatible with SAS protocol, SATA protocol and PCIe protocol.

5. The storage device according to claim 1, wherein the first housing has a first opening and a second opening, the first electric connector is partially penetrated through the first opening, and the second electric connector is partially penetrated through the second opening.

6. The storage device according to claim 5 further comprising a third electric connector, wherein the third electric connector is disposed on the circuit board, the first housing further has a third opening, and the third electric connector is partially penetrated through the third opening.

7. The storage device according to claim 1, wherein a length of the first housing is 100 mm, and a width of the first housing is 70 mm.

8. A storage device, comprising:
   a first housing;
   a second housing matched with the first housing and connected with the first housing;
   a first circuit board disposed between the first housing and the second housing;
   a first electric connector disposed on the first circuit board;
   a first storage unit disposed on the first circuit board and electrically connected with the first electric connector;
   a second circuit board disposed between the first housing and the second housing and disposed parallel to the first circuit board;
   a second electric connector disposed on the second circuit board; and
   a second storage unit disposed on the second circuit board and electrically connected with the second electric connector, wherein the first storage unit and the second storage unit are independent from each other.

9. The storage device according to claim 8, wherein the first housing has a first opening and a second opening, the first electric connector is partially penetrated through the first opening, and the second electric connector is partially penetrated through the second opening.

10. The storage device according to claim 9 further comprising a third electric connector, wherein the third electric connector is disposed on the first circuit board and the second circuit board, the first housing further has a third opening, and the third electric connector is partially penetrated through the third opening.

11. A storage device, comprising:
    a first housing;
    a second housing matched with the first housing and connected with the first housing;
    a circuit board disposed between the first housing and the second housing;
    a first electric connector disposed on the circuit board, wherein the first electric connector is a Nano-pitch I/O connector;
    a storage unit disposed on the circuit board and electrically connected with the first electric connector; and
    a second electric connector disposed on the circuit board, wherein the second electric connector is a SATA power connector.

12. The storage device according to claim 11, wherein the first electric connector is disposed adjacent to the second electric connector.

13. The storage device according to claim 11, wherein the second electric connector is electrically connected with the storage unit for powering the storage unit.

* * * * *